United States Patent
Sievers et al.

(10) Patent No.: US 11,571,920 B2
(45) Date of Patent: Feb. 7, 2023

(54) METHOD FOR PERSISTENT MARKING OF FLEXO PLATES WITH WORKFLOW INFORMATION AND PLATES MARKED THEREWITH

(71) Applicant: Esko-Graphics Imaging GmbH, Itzehoe (DE)

(72) Inventors: Wolfgang Sievers, Kremperheide (DE); Joachim Scheele, Oldendorf (DE); Jörg Wolterink, Oelixdorf (DE); Pascal Thomas, Hamburg (DE); Robert Bruce, Itzehoe (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 71 days.

(21) Appl. No.: 17/045,253

(22) PCT Filed: Feb. 1, 2019

(86) PCT No.: PCT/EP2019/052536
§ 371 (c)(1),
(2) Date: Oct. 5, 2020

(87) PCT Pub. No.: WO2019/192764
PCT Pub. Date: Oct. 10, 2019

(65) Prior Publication Data
US 2021/0174042 A1 Jun. 10, 2021

Related U.S. Application Data

(60) Provisional application No. 62/653,972, filed on Apr. 6, 2018.

(51) Int. Cl.
*B41M 1/04* (2006.01)
*B41F 13/12* (2006.01)
(Continued)

(52) U.S. Cl.
CPC .............. *B41M 1/04* (2013.01); *B41C 1/00* (2013.01); *B41F 13/12* (2013.01); *B41M 3/14* (2013.01);
(Continued)

(58) Field of Classification Search
CPC .... G06K 1/121; G06K 7/1413; G06K 7/1417; G06K 7/00; G06K 7/1404; G06K 19/06037
(Continued)

(56) References Cited

U.S. PATENT DOCUMENTS

| 4,872,407 A | 10/1989 | Banke |
| 6,786,153 B2 | 9/2004 | Burrow et al. |

(Continued)

FOREIGN PATENT DOCUMENTS

| CN | 1920663 A | 2/2007 |
| CN | 200984850 Y | 12/2007 |

(Continued)

OTHER PUBLICATIONS

International Search Report and Written Opinion for International Application No. PCT/EP2019/052536, dated Jun. 18, 2019, 12 pages.

(Continued)

*Primary Examiner* — Edwyn Labaze
(74) *Attorney, Agent, or Firm* — RatnerPrestia

(57) ABSTRACT

Systems and methods for making a flexo plate, and plates, machines, readers, and computer readable media for use therewith. In the system, a plurality of processing machines, each configured to perform one or more process steps in a workflow, includes a controller, a variable operating parameter controlled by the controller, and a reader configured to read machine-readable indicia on the flexo plate. The machine-readable indicia (e.g. bar code, RFID tag, text) is (Continued)

configured for persistent readability downstream of washing (and cutting) steps, without printing in the printing step. The indicia may embody information including at least a plate identifier and instructions corresponding to the at least one variable operating parameter for each of the processing machines or information corresponding to an address in computer storage where the information resides.

22 Claims, 2 Drawing Sheets

(51) Int. Cl.
    *B41M 3/14*     (2006.01)
    *B41N 1/12*     (2006.01)
    *B41C 1/00*     (2006.01)
    *G06K 1/12*     (2006.01)
    *G06K 7/14*     (2006.01)

(52) U.S. Cl.
    CPC .............. *B41N 1/12* (2013.01); *G06K 1/121* (2013.01); *G06K 7/1413* (2013.01); *B41P 2200/12* (2013.01)

(58) Field of Classification Search
    USPC ...... 235/462.1, 462.09, 462.07, 462.01, 454, 235/375
    See application file for complete search history.

(56) References Cited

U.S. PATENT DOCUMENTS

| | | | |
|---|---|---|---|
| 7,126,724 B2 | 10/2006 | McCrea et al. | |
| 7,300,728 B2 | 11/2007 | Manness | |
| 7,717,040 B2 | 5/2010 | Shishkin | |
| 7,810,731 B2 | 10/2010 | Johnson et al. | |
| 7,908,967 B2 | 3/2011 | Kwon et al. | |
| 8,757,479 B2 | 6/2014 | Clark et al. | |
| 9,016,199 B2 | 4/2015 | Ramakrishnan | |
| 9,375,916 B2 | 6/2016 | Thomas et al. | |
| 10,518,524 B2 | 12/2019 | Tashiro | |
| 10,919,330 B2 | 2/2021 | Wattyn | |
| 2002/0120493 A1* | 8/2002 | Mormile | G06Q 30/06 700/100 |
| 2005/0157347 A1* | 7/2005 | Dewitte | H04N 1/4057 358/536 |
| 2007/0084368 A1 | 4/2007 | Vest et al. | |
| 2009/0195837 A1* | 8/2009 | Dardikman | B41C 1/00 358/3.29 |
| 2010/0028815 A1 | 2/2010 | Zwadlo | |
| 2010/0060909 A1 | 3/2010 | Conescu et al. | |
| 2011/0079161 A1 | 4/2011 | Amsili et al. | |
| 2011/0189600 A1* | 8/2011 | Plumer | B41C 1/1083 430/30 |
| 2011/0308411 A1 | 12/2011 | Thomas et al. | |
| 2012/0003588 A1* | 1/2012 | Choi | G03F 7/24 430/306 |
| 2012/0048133 A1 | 3/2012 | Burberry et al. | |
| 2013/0056542 A1 | 3/2013 | Gnutzmann et al. | |
| 2014/0076184 A1 | 3/2014 | Anderson, III | |
| 2014/0166761 A1 | 6/2014 | Todeschini et al. | |
| 2014/0326152 A1 | 11/2014 | Gartner et al. | |
| 2015/0097889 A1 | 4/2015 | Maneira | |
| 2015/0217558 A1 | 8/2015 | Bielak | |
| 2018/0035614 A1* | 2/2018 | Davis | G01N 33/0098 |
| 2018/0216345 A1 | 7/2018 | Wolterink et al. | |
| 2020/0016916 A1 | 1/2020 | Sievers et al. | |
| 2021/0187934 A1 | 6/2021 | Muehlfeit et al. | |
| 2021/0245542 A1 | 8/2021 | Kaufmann et al. | |

FOREIGN PATENT DOCUMENTS

| | | | | |
|---|---|---|---|---|
| CN | 101283314 | A | 10/2008 | |
| CN | 103959435 | A | 7/2014 | |
| CN | 108463352 | A | 8/2018 | |
| DE | 102018115146 | A1 | 12/2019 | |
| EP | 0169294 | A2 | 1/1986 | |
| EP | 1531014 | A2 | 5/2005 | |
| EP | 1557279 | A2 | 7/2005 | |
| EP | 2397327 | A2 | 12/2011 | |
| EP | 2428360 | A1 * | 3/2012 | ............ B41F 27/005 |
| EP | 2722713 | A2 | 4/2014 | |
| FR | 3085304 | A1 | 3/2020 | |
| JP | 2000181051 | A | 6/2000 | |
| JP | 2002223095 | A * | 8/2002 | |
| JP | 2004038144 | A | 2/2004 | |
| JP | 2005326722 | A * | 11/2005 | |
| JP | 2006048053 | A * | 2/2006 | ............... B41C 1/00 |
| JP | 2010528905 | A | 8/2010 | |
| JP | 2013507269 | A | 3/2013 | |
| JP | 2017161885 | A | 9/2017 | |
| WO | 2010014156 | A1 | 2/2010 | |
| WO | 2016132828 | A1 | 8/2016 | |
| WO | 2017072588 | A2 | 5/2017 | |
| WO | 2019110809 | A1 | 6/2019 | |
| WO | 2019192764 | A1 | 10/2019 | |

OTHER PUBLICATIONS

International Search Report and Written Opinion for International Application No. PCT/EP2019/073200, dated Nov. 15, 2019, 9 pages.
International Application No. PCT/EP2019/073200, dated Aug. 30, 2019, 27 pages.
U.S. Appl. No. 62/839,171, filed Apr. 26, 2019, 32 pages.
International Preliminary Report on Patentability and Written Opinion for International Application No. PCT/EP2019/052536 dated Oct. 6, 2020, 10 pages.
International Search Report and Written Opinion for International Application No. PCT/EP2020/078112, dated Jan. 29, 2021, 18 pages.
Entire patent prosecution history of U.S. Appl. No. 16/433,873, filed Jun. 6, 2019, entitled, "System and Process for Persistent Marking of Flexo Plates and Plates Marked Therewith".
Entire patent prosecution history of U.S. Appl. No. 16/559,702, filed Sep. 4, 2019, entitled, "System and Process for Persistent Marking of Flexo Plates and Plates Marked Therewith".
Non Final Office Action for U.S. Appl. No. 16/433,873, dated Jun. 9, 2021, 28 pages.
Non Final Office Action for U.S. Appl. No. 17/056,584, dated Jun. 10, 2021, 13 pages.
International Search Report and Written Opinion for International Application No. PCT/EP/2019/076922, dated Jan. 7, 2020, 15 pages.
Invitation to Pay Additional Fees and Partial Search Report for International Application No. PCT/EP2021/082848, dated Mar. 21, 2022, 15 pages.
Chinese Office Action for Chinese Application No. 201980038697.2, dated Mar. 14, 2022 with translation, 15 pages.
Guo, W. et al., "Image Relief Algorithm and Its Application in Security Printing," Feb. 5, 2011, vol. 3(1), 5 pages, China Printing and Packaging Study (abstract only).
Xu, S., "A Few Questions about Flexographic Printing Technology," Feb. 10, 1996, 2 pages, China Packaging Industry.
International Preliminary Report on Patentability and Written Opinion for International Application No. PCT/EP2020/078112, dated Apr. 12, 2022, 12 pages.
European Communication pursuant to Article 94(3) for European Application No. 19 780 253.1, dated Apr. 28, 2022, 6 pages.
Japanese Notice of Reasons for Refusal for Japanese Application No. 2021503199. dated Sep. 20, 2022 with translation, 13 pages.
Extended European Search Report for European Application No. 22195757.4, dated Dec. 22, 2022, 10 pages.

* cited by examiner

METHOD FOR PERSISTENT MARKING OF FLEXO PLATES WITH WORKFLOW INFORMATION AND PLATES MARKED THEREWITH

This patent application is a U.S. National Phase Patent Application of PCT No. PCT/EP2019/052536, filed 1 Feb. 2019, which claims priority to U.S. Provisional Patent Application No. 62/653,972, filed on 6 Apr. 2018, the contents of which are incorporated herein by reference in their entirety for all purposes.

BACKGROUND OF THE INVENTION

Most contemporary raster image processing (RIP) software, such as, for example, the RIP available with ESKO Automation Engine software, sold by Esko Software BVBA of Ghent, Belgium, allows creation of Barcodes or QR-codes, which can be added to the image information on a flexographic printing plate. However, the possibilities of this feature are typically not fully utilized.

A typical flexo plate workflow may comprise the following steps:
1. Processing image information, using a raster image processor, at a certain screen resolution to obtain an image file.
2. Using the processor, combining the image file with other image files to create an imaging job that covers a full polymer plate format.
3. Imaging the image files onto a Laser Ablation Mask (LAM) layer on top of a photopolymer plate, by any of various methods known in the art, thereby creating a mask on top of the plate.
4. Curing the rear side of the plate, such as with UVA light, to build a floor of polymer.
5. Curing the photopolymer through the mask on top of the plate, such as with UVA light.
6. Processing the plate to remove non-cured polymer from the plate.
7. Optionally, drying the plate to remove solvent (typically not performed when the processing is done by a thermal process).
8. Finishing the plate, such as by applying UVA and UVC light.
9. Separating the different image files, such as by cutting the polymer plate into patches on a xy-cutting table.
10. Mounting one or more of the plate patches, each of which embodies one or more image files, to a printing press, such as on a printing press cylinder.
11. Printing physical images on a print-receiving substrate using the plate in a printing press.
12. Cleaning ink from the plate, removing the plate from the press, and storing it for future use, such as a reprinting job.

The process steps between image RIPping and printing the physical image may be executed in a sequence that is not directly temporal. Some of the consecutive steps may be delayed by a transport process. For example, between the steps of separating the images on the xy-cutting table and mounting them on a printing cylinder, the plate patches may be shipped from a plate manufacturer to a printing facility.

Despite recent advances in automation for plate making, only some process steps may be suitable for combination in an automated manner into consecutive steps. Hence, many steps may still be executed independently from the others. As many plate makers have two or more production rows and the equipment for the different production rows may not be identical, two plates having identical images may run through different equipment when processed in parallel.

As a consequence, the use of workflow markings, if used at all, is typically limited to only general information, because attaching equipment-specific parameters to a plate that may be processed on different devices with different parameter settings may not be efficient or useful. Accordingly, parameters are typically set for different process steps manually. Consequently, human errors may cause a certain percentage of failure, resulting in plate loss, rework and loss of money.

Thus, while it may be known to include some kind of markings on a printing plate, typical prior art markings only contain information used for recognizing the plate in a later process step such as for example, information identifying the Job and Customer name. Plate markings may also be used to identify the type of the plate.

One limitation of prior art marking methods for flexo plates is that they typically only contain a small amount of information that does not support the entire plate workflow. Frequently, the marks are removed during processing of the plate at a certain point in the workflow, requiring downstream operators to look up plate-processing parameters and manually key them in to the user interfaces of various processing equipment.

Thus, there is a need in the art to eliminate the problem of incomplete and lost information during the passage of a flexographic printing plate through the plate making workflow, thus improving the central control of the plate workflow and helping to avoid operator mistakes, time loss and money loss.

SUMMARY OF THE INVENTION

Exemplary embodiments of the invention include a system for making a flexo plate. The system comprises a plurality of processing machines, each processing machine configured to perform one or more process steps in a workflow, including at least an imaging step, a curing step, a washing or other non-cured-polymer-removal step, a printing step, and optionally, a cutting step, a storage step, or a combination thererof, each processing machine having a controller and at least one variable operating parameter controlled by the controller. The system includes means for providing machine-readable indicia on the flexo plate. The machine-readable indicia is configured for persistent readability downstream of the washing (and cutting, where present) steps without printing in the printing step. The machine-readable indicia may embody information including at least a plate identifier and instructions corresponding to the at least one variable operating parameter for each of the processing machines or information corresponding to an address in computer storage where the information resides.

The means for providing the indicia may comprise a computer programmed with instructions for embedding information into a code, such as a 2-dimensional code such as a QR code, a barcode, or any machine readable code known in the art, as well as a computer programmed with instructions for providing information formatted for embedding into a magnetic stripe or into a chip, such as an RFID chip, capable of being read by any reader known in the art. The means for providing the code may further comprise a printer for printing a 2-D code, an imager for embedding the code into a printing plate such that the code will be readable after plate processing, as well as after the full set of plate processing steps to which that plate is configured to be processed. The means for providing an RFID code comprises machines for writing information onto an RFID-readable chip and machines for writing information into a magnetic stripe, as are known in the art, along with any of the processing equipment known in the art required for fabricating an RFID chip and accompanying antenna(s) into a fully functional RFID module or for creating a magnetic stripe and applying the stripe to a surface.

As described herein, the indicia may be disposed in a strip of polymer in the plate. In one embodiment, the indicia may be in a portion of the plate that is later cut off. In some embodiments, the indicia may be disposed on a floor of the plate using areas of presence and absence of polymer in the plate floor, and/or by clusters of microdots arranged according to the code.

A plurality of readers are configured to read the indicia on the flexo plate, including at least one reader in communication with each controller of each processing machine. The reader may comprise a mobile device, such as a mobile phone, a tablet computer, or the like, having a camera and programmed with instructions to capture an image of the code. The mobile device may have instructions stored thereon for converting the image information to the information readable by the controller and/or information displayed on a display and readable by a human operator, or the mobile device may communicate over a network, such as a wireless network, to a central processor that converts the image to the information readable by the controller. The information for instructing the controller may be transmitted to the controller by the mobile device directly upon conversion of the image information to such instructions, or by the central processor to the controller upon receipt of the image from the mobile device, or by the central processor back to the mobile device, and then to the controller. In other systems, the reader may be directly connected to the processing machine and dedicated to that machine. In some embodiments, including for mobile devices or dedicated readers, the reader may be connected to or in communication with the machine via a wired connection or via a local wireless connection, such as via Bluetooth technology.

Exemplary controllers are configured to receive from the reader instructions corresponding to the variable operating parameters stored in or linked to the indicia and to control the processing machine in accordance with that at least one instruction. Such a controller may comprise a computer processor, accompanying media for storage of machine-readable instructions, and accompanying connections to the various portions of the processing machine in the workflow for conducting the process, all of which components are well-known in the art. The controller is programmed with instructions for receiving the information from the reader corresponding to the variable operating parameters, and incorporating those parameters into the control instructions provided by the controller to the various portions controlled thereby. It should be understood that the various portions controlled by the controller may be digital or analog devices, and to the extent necessary, the controller, or converters connected thereto, may convert control information from digital to analog and sensed feedback or monitoring from analog to digital formats, or vice versa.

In one embodiment, the workflow comprises a proofer, and the information read from the indicia may include quality information indicative of printing properties associated with the plate.

Preferred embodiments also include a tracking controller for the workflow in communication with each of the plurality of readers. The tracking controller is configured to receive from each of the plurality of readers a communication indicative of time and in-process location of each flexo plate scanned by the reader. The tracking controller is further configured to provide an output indicative of real-time workflow positions of a plurality of in-process flexo plates. This output may be provided to a display screen connected to a central processor running instructions for operating the tracking controller, and may also be provided to the mobile devices operative as readers and/or to displays associated with any computer connected to a network connected to the tracking controller. The tracking controller comprises a processor and instructions, stored on computer readable media, for programming the processor to receive and store information from the plurality of readers and to process that information into a tracking report output.

Aspects of the invention also include flexo plates created using the processes as described herein. Exemplary flexo plates have machine-readable indicia on the flexo plate that is configured for persistent readability downstream of washing (and cutting, when present) steps without printing in a printing step of a plate workflow. The machine-readable indicia embodies information including instructions corresponding to at least one variable operating parameter for each of a plurality of processing machines or embodying information corresponding to an address in computer storage where the instructions reside, as described herein. The indicia may comprise, for example, a 2-dimensional code, such as a QR-code or a bar code, or an RFID module or a magnetic stripe. As described herein, the indicia may be disposed in a strip of polymer in the plate and/or may be disposed on a floor of the plate using areas of presence and absence of polymer in the plate floor, such as may be created by the use of clusters of microdots arranged in the LAMS layer so as to produce structures that rise above the floor slightly but not a printing level. And, as described herein, a first rendering of the indicia may be located in a first location on the plate and a second rendering of the indicia may be located on a second location on the plate, particularly wherein the first location is in a portion of the plate configured to be cut away from the plate and the second location is in a floor of the plate in an imaged area of the plate.

Other aspects of the invention include computer readable media comprising non-transitory instructions readable by a machine, the instructions embodying any of the method and process steps as described herein. Such instructions may include instructions for coordinating a process for making a flexo plate having a plurality of process steps, including, for example, at least an imaging step, a curing step, a washing step, and a printing step, each step performed by a processing machine having at least one variable operating parameter. The machine readable instructions may include instructions for providing machine-readable indicia on the flexo plate, including embodying in the indicia information including at least a plate identifier and instructions corresponding to the at least one variable operating parameter for each of the processing machines. The foregoing would be embodied in, for example, software, digital storage media embodying the instructions, and machines programmed with the software and firmware, for creating the indicia on the plates.

The machine readable instructions may also comprise software, and machines programmed with such software, for the tracking controller. Such instructions may include instructions for providing machine-readable indicia on the flexo plate, including embodying in the indicia information corresponding to an address in computer storage. The instructions may also include instructions for storing, in the computer storage in a location identified by the address, information including at least one variable operating parameter for each of the processing machines. The program may also include instructions for receiving a communication from a reader of the indicia, and instructions for transmitting variable operating parameters to a corresponding one of the processing machines. Such a system may further include instructions for implementing a tracking controller for the workflow, the tracking controller in communication with each of the readers associated with each of the processing machines, and configured to receive communications from a plurality of readers configured to read the indicia from a plurality of in-process flexo plates in the workflow, wherein the indicia also includes a plate identifier. The communications received from the reader include locations of the in-process flexo plates. The programmed instructions further include instructions for providing realtime tracking of a workflow position for each of the plurality of in-process flexo plates based upon the communications and instructions for providing the tracking information as a output.

Still another aspect of the invention include flexo plate processing machines capable of performing at least one plate processing step in a plate processing workflow, the machines include a controller configured to receive a communication of one or more variable parameters for controlling the plate processing machine from a reader as described herein. The reader is in communication with the controller configured to read machine-readable indicia on a flexo plate to be processed, the indicia having embodied therein at least instructions corresponding to the variable operating parameters or information corresponding to an address corresponding to a location in computer storage where said instructions reside. The reader is configured to read the instructions embodied in the indicia or at the address corresponding to the information embodied in the indicia, and send the communication to the controller with the at least one variable operating parameter after obtaining the at least one variable operating parameter from reading the indicia or from querying the computer storage address corresponding to the information embodied in the indicia. The controller is also configured to control the processing machine based at least in part upon at least one variable operating parameter received from the reader.

Yet another aspect of the invention includes readers for use in the systems and processes for making a flexo plate as described herein/Such readers may have at least one detector configured to read the indicia from the flexo plate, such as a camera for reading a 2-D code, an RFID receiver and transmitter, or transceiver, for sending an RF signal and receiving an RFID response transmission from an RFID, or a magnetic stripe reader. A communication link in the reader is in communication with at least a controller of at least one processing machine configured to perform at least one of the process steps and a central processor configured to monitor the workflow. The reader also may have a processor configured to process the information read from the indicia, to communicate to the controller of the at least one processing machine the at least one variable operating parameter embodied in the indicia or stored at the address corresponding to information embodied in the indicia, and to communicate to the central processor information regarding the flexo plate read by the reader and a location of the reader within the workflow. The communication to the controller may be direct communication, or a communication that includes intermediate communications between the reader and a central computer. In particular, when the indicia represents an address on a network, the reader may be capable of reading the address, linking to the address, downloading the information from the address, and communicating the information to the processing machine. The communication to the processing machine may be by any wired or wireless communication method known in the art, including but not limited to those expressly described herein.

DETAILED DESCRIPTION OF THE INVENTION

Figure 1:
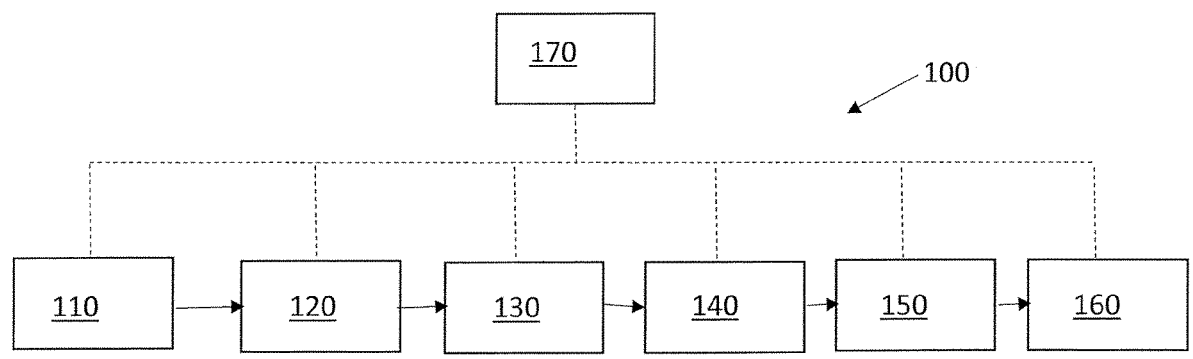
FIG. 1 is a schematic diagram depicting an exemplary embodiment of the invention comprising a workflow process with a tracking controller.

Referring now to the figures, FIG. 1 schematically illustrates a workflow 100 having a plurality of process machines 110, 120, etc. each configured to perform one or more process steps in the workflow of creating a printing plate.

Figure 2A:
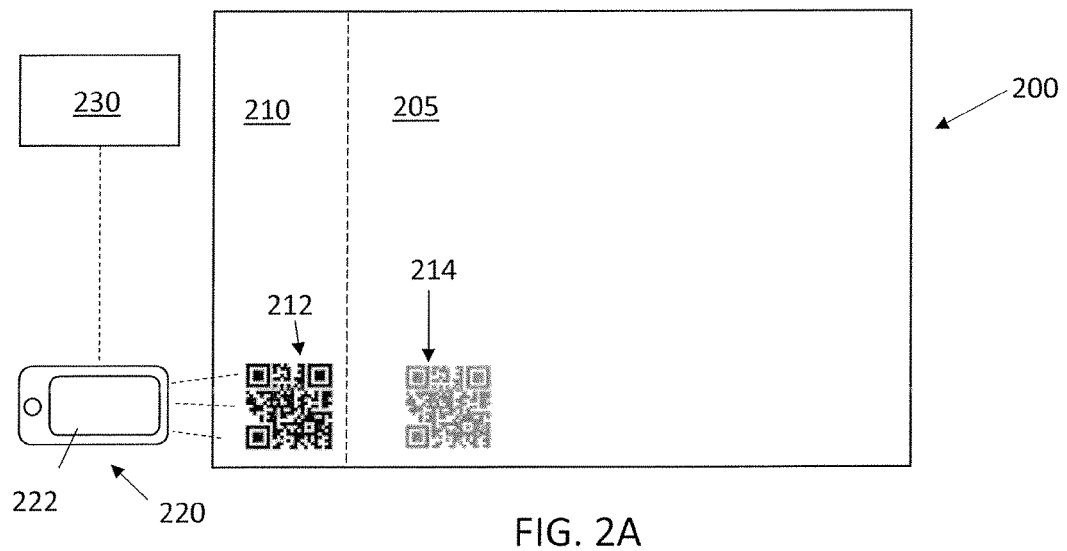
FIG. 2A is a schematic diagram depicting a plate having indicia read by a reader in communication with a controller in an exemplary workflow system embodiment of the invention.
Figure 2B:
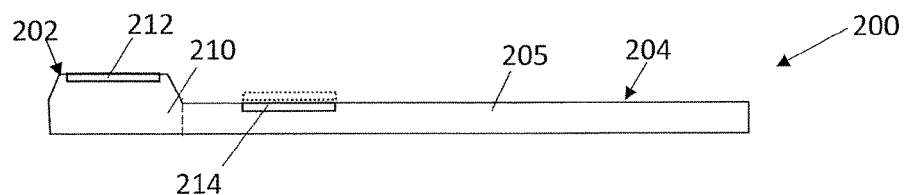
FIG. 2B is a schematic cross sectional diagram of an exemplary flexo plate having first and second indicia in accordance with one embodiment of the invention.

As depicted in FIGS. 2A and 2B, one aspect of the invention provides a marking method and structure for flexographic printing plates 200 and their precursor states, which enables the association of up-to-all process-relevant information to the plate itself by attachment of indicia 212, 214 to the plate, and thereby enables controlling up-to-all process stages using this information. Preferably, the processing machines used for the plates are also configured with or in communication with a reader 220 configured to read the marks, and configured to receive process parameters required for the plate to be processed and to report the status of plates being processed to a central control computer 170, based upon information derived from reading the marks. Embodiments of the system thus enable monitoring and control of the complete platemaking process for all plates in the workflow chain from order intake to plate storage after printing.

While the parameters for RIPping and imaging are provided directly from a computer by a data file, the parameters for the remaining steps are ideally attached to the plate in accordance with aspects of the invention. Exemplary steps in the workflow may include a UV exposure step performed by a UV exposure system 110, a thermal or chemical processing step performed by thermal or chemical processing apparatus 120, a finishing step performed by finishing apparatus 130, a cutting step performed by cutting apparatus 140, mounting one or more cut portions of a plate onto a substrate with a mounting apparatus 150, and printing in a flexo process with a printer 160, using the substrate having the plate portions mounted therein. Additional steps may also be included in the workflow at the beginning or end, and interposed between any of the steps specifically depicted. For example, an imaging step typically precedes the UV exposure step, and an ordering step typically precedes the imaging step, and a storage step follows the printing step. The blocks associated with each processing step are exemplary only, and a single machine may perform steps related to multiple blocks, or multiple machines may together perform the steps illustrated in a single block. Some steps depicted may be optional.

This attachment to a plate 200 can, for example, be accomplished using machine readable indicia 212, which may be a 2D code such as a QR-code or a barcode, a radio-frequency identification (RFID) module, or a magnetic strip. One form of machine readable indicia may comprise a 2D code in the form of alphanumeric characters readable by a human as well as configured to be captured by a camera and processed using text recognition software known in the art, providing the advantage of providing a code on the plate that can be read and interpreted by both a human operator and a machine. The RFID module may be inserted into the polymer before or after curing at a spot of solid image area on the plate where the polymer is to be cured (and thus retained on the fully exposed plate). In exemplary embodiments with a magnetic strip, the strip is preferably attached to the rear side of the plate on the dimensionally stable PE layer of the plate, where the strip can come in contact with a reading head mounted on the processing machine as the plate is processed. The magnetic strip may be attached as a completed strip formed by any method known in the art, or may comprise a magnetic ink dispensed directly onto the rear side of the plate. Although the indicia 212 is depicted as a QR code in the figures, it should be understood that the QR code in the figures is intended as a schematic representation application to any of the types of indicia described herein, or their equivalents.

Although certain indicia have been explicitly described, the term "indicia" is intended to have its broadest meaning of "an indication" or "distinguishing mark," without limitation to how that indication or mark is capable of being read, and thus the "equivalents" of the indicia as expressly described are intended to be broadly construed. While certain machine-readable indicia or codes may take advantage of formats that are exclusively machine readable to permit a large volume of information to be stored in a small amount of space, it should be understood that the term "machine readable," as used herein to refer to indicia and codes, is not limited to indicia having a format that is exclusively machine-readable. Those of skill in the art will appreciate that human readable alphanumeric information is also machine readable by a reader equipped with suitable optical character recognition (OCR) functionality, and that the hardware and software for providing such functionality is well known in the art and becoming more ubiquitous. For example, many highway toll authorities now use character recognition of license plates as an equivalent to, a substitute for, or supplement to RFID pass technology. Furthermore, machine vision systems and human operators alike can also be trained to read non-alphanumeric graphic symbols to convey information that can be universally understood (e.g. the graphic symbols denoting recyclable materials or laundry care recommendations). Thus, it should be understand that the terms "indicia" and "machine readable" are intended to be broadly interpreted to include, without limitation, in addition to the other types of indicia discussed in detail herein, printed or otherwise visible alphanumeric or graphical information configured to be read and comprehended by human operators as well as machines, as well as combinations of indicia that are exclusively machine readable with indicia that is both human and machine readable. One advantage of using machine readable indicia that is also at least partially human readable, is that an experienced human operator may be able to process and act upon at least some codes faster than it would take that same operator to enlist the assistance of a machine.

In some embodiments, the code for a printed code, such as a bar code or a QR code, may be added during ripping the image file and is thus included in the content of the image information, such as in the .LEN file associated with an Esko PlatePrep workflow. Adding a code to an image file may be accomplished using, for example, Esko DeskPack™ barX software, which software comprises machine-readable instructions embodied in storage media, such as a hard drive, a flash drive, or any type of media, as is well known in the art.

The following examples refer to QR-codes as the exemplary information storage technology, but the invention is not limited to any particular information storage technology, and is applicable to any information storage technology known in the art capable of conveying the amount of information required to practice embodiments of the invention, and in particular, to any of the storage technology expressly described herein.

In preferred embodiments, all processing equipment 110-160 in the workflow 100 are provided with or connected to a scanner or other information capture device, herein referred to as a "reader," which allows reading the indicia to obtain the associated plate process parameters. Thus, in preferred embodiments, before starting the process or processing step, process information is scanned from the plate and the relevant process parameters are set accordingly. For example, where the indicia 212 comprises a visible code, such as a QR code or a barcode, the reader 220 may comprise a mobile device, such as a mobile phone, a handheld computer, a tablet, or the like. Although reader 220 is depicted as a "phone," it should be understood that the figure is intended to be a schematic representation of any applicable reader, and may comprise any type of reader known in the art suitable for reading the indicia provided. Thus, for example, where code 212 comprises an RFID tag, the reader comprises an RFID reader, and where code 212 comprises a magnetic stripe, the reader comprises a magnetic stripe reader. The technologies and apparatus associated with reading 2-dimensional printed codes, magnetic stripes, and RFID tags are well understood in the art. Reader 220 is connected to controller 230 of the apparatus for performing the identified process step. The connection between the reader and the controller may be a wired or wireless connection. An exemplary wireless connection may comprise a local wireless network running on computers local to a facility in which the processing step is located, or may be a network connected to a global information network or wireless communication network. Controller 230 may be programmed with instructions for translating the information derived from the indicia into the information required to set the corresponding parameters of the processing equipment, or the translation instructions may be contained in the reader. The information derived from the reader may be embedded directly in the indicia, or the indicia may comprise information corresponding to an address in computer storage on a network where the information resides in communication with the reader and the controller. The information corresponding to the address may be a URL, a process identifier, or a unique plate identifier. In an embodiment in which the information is a unique plate identifier, the system may be configured to use the unique plate identifier to find the corresponding instructions, such as using by using the plate identifier to query a lookup table that resides at a known address. In embodiments where tracking specific plates is not of interest, and where the processing instructions corresponding to the universe of plates to be processed have only a limited number of permutations, the information corresponding to the address may be a process identifier rather than a unique plate identifier. In such embodiments, the process identifier may be used for querying a corresponding lookup table of process instructions corresponding to each process identifier. In embodiments in which the instructions are embedded in the identifier, the indicia may also further embody a unique plate identifier, wherein the plate identifier may be used for tracking the plate or identifying the plate, such as with a mobile device, as described herein later.

Process information may include, for example and without limitation: the job name, customer name, printer's name, plate type, plate thickness, back exposure energy, preferred back exposure time, main exposure energy, preferred main exposure time, number of main exposure cycles, plate processing speed, plate processing temperature, plate cutting path, plate cutting speed, and the like.

In one embodiment of the invention, process information is stored in the indicia 212, such as a QR code. Reading a QR code from a plate can be performed with an existing QR-code reader (i.e. a code scanner) known in the art. For example, a model C5PC003 code scanner from Wenglor is suitable for omnidirectional scanning of 1D and 2D codes, including but not limited to 1D codes (commonly referred to as "barcodes"), such as Code39, Code93, Code128, UPC/EAN, BC412, Interleaved 2 of 5, Codabar, Postal Codes, Pharmacode, and 2D codes, such as DataMatrix ECC 0 . . . 200, PDF417, Micro PDF417, QR-Code, Micro QR-Code, Aztec Code, GS1 Databar, and Dot code. The indicia used for providing the information is not limited to any particular type of code. In order to increase contrast and readability of the code on the plate, light from a light source (not shown), such as a light typically associated with a camera flash for a mobile device, may be applied from the bottom or the top of the plate. In preferred embodiments, process parameters for different stages are embodied directly in the code such that each individual processing unit can derive instructions directly from the code on the plate without having to connect to a network. In other embodiments, the code may comprise a computer storage address where the process information is stored, and the reading step comprises reading the information, connecting to the storage address embedded in the information such as via a hyperlink, reading the information from the storage address, and communicating relevant stored information to the processing machine.

In one embodiment of the invention, illustrated in FIGS. 2A and 2B, the information is at least initially stored in a first indicia location 212, such as in the form of a QR code, which location is disposed on a test strip 210 adjacent the image area 205 of a flexo polymer plate 200. This test strip may also contain register and color proof marks for setting up the press. While, preferably, the register marks and other marking on the test strip (and thus also the QR code, when placed on such a test strip) stay on the polymer plate together with the image for the entire life of the plate, in some embodiments it may be necessary to cut the test strip away from the plate to avoid printing the information on the test strip, such as a QR code, on the printing substrate. Embodiments to address this situation are discussed herein later.

Providing code information that is persistently readable during all process steps (e.g. imaging, curing, washing, printing, and optional cutting and storage steps) is a challenge in connection with washing processes associated with flexo plates, because most washing processes are solvent-based. The solvent not only removes non-cured portions of the flexo plate polymer, but it also removes ink of the type typically used on printed labels and marker pens. Thus, one aspect of the invention relates to providing a code configured to survive a washing step by making the code part of the image or by inserting information into cured portions of polymer. For example, an RFID device may be inserted into the cured portion of the polymer mechanically, or a magnetic strip may be disposed on the surface of the dimensionally stable layer on the rear side of the polymer plate where it is positioned to be read by a magnetic card reader head as is known in the art. Such an RFID device or mag strip must be capable of surviving the downstream processing steps, however. While adding coded information to the image enables persistence past the washing step, in some embodiments it is undesirable for the codes to be printed. Thus, preferred embodiments may include codes embodied in the plate in a way that is persistent past a washing step, but not printed in a printing step. In one embodiment, the code is added only in the plate floor, such that the details do not reach the printing surface, as described below. In another embodiment, the code is placed in a location beyond the desired portion of the printed image (e.g. in a test strip) and, in some cases, the code is transferred to another location prior to or during a cutting operation, also as described below.

As used herein, the "washing" step may refer to any non-cured-polymer-removal step that removes non-cured polymer from the plate. Such a "washing" process may include a traditional solvent (or water) washing step, or may also include a thermal method, such as those commonly associated with DuPont™ Cyrel® FAST Thermal Workflow or MacDermid® LAVA® plates, as known to those of skill in the art. Thus, the phrase "washing step" as used generally herein should be understood to refer to any non-cured-polymer-removal step, absent explicit reference to specific washing processes.

In some embodiments, to keep the information in the code on the plate 200, instead of being located on a plate top surface 202, the 2D code, such as a QR-code 214, may be positioned in the plate floor 204. The plate floor is built by polymer that has been cured from the backside of the plate, but it is not intended to print, thus the thickness of the floor stays below the level of the printing top surface of the polymer.

Although not limited to any particular method for providing the indicia, there are several preferred ways for providing indicia structures into the polymer. One preferred method is to provide the indicia via UV exposure through an imaged mask, such as via direct imaging in the mask. This method may place sunken structures on the printing surface level, or micro dots that produce elevated structures on the floor. Another method is laser engraving, which may provide sunken structures below either the printing surface level or the floor level. Yet another method is to mill sunken structures below either the printing surface level or the floor level.

In some embodiments, a code 212 that resides below the top (printing) surface 202 of a test strip 210 of the plate 200 during some process steps may be transferred from the top surface to the floor surface 204. For example, code 212 may be scanned by the reader and the code or code image stored in a data file and then that data file may be used for instructing the cutting of a reproduction of the code image 214 into a floor portion 204 of the image area 205 of the plate while the plate is on the cutting table. As depicted in FIG. 2A, code 214 depicted in a lighter shade is intended to represent its location on the floor of the plate where it will not cause an image corresponding to the code to print when the top surface is used for printing. As depicted in FIG. 2B, code 214 (solid lines) may be cut into floor 204, such as formed by laser engraving or cutting with a milling head. In another embodiment, the code 214 (dashed lines) may be formed on top of the floor surface 204, such as formed using micro dots in the LAMS layer during the exposure step, such that the code rises to a level above the floor 204, but below the top printing level 202.

In many cases, plates are placed on a cutting table for separating different plate patches from another, and in some cases, also to cut off the test strip or any other markings not intended for printing. In a preferred embodiment, reproducing code 214 on the back of the plate identical to code 212 may be performed using a laser, such as, e.g. a 10.6 µm CO2 Laser or a fiber laser emitting in the mid-infrared range (e.g. a 2 µm Thulium laser), such as in a range of wavelengths between 1.8 and 2.5 µm, and in one preferred embodiment, 2.03 µm. The laser, such as coupled to a laser Galvo scanner, removes the positive or negative portions corresponding to the QR-code image, thus providing the binary differences detectable by a reader. Thus, code 212 may first be read in its first location on the top side 202 of plate 200 on the test strip 210 prior to cutting off the test strip 210, then the code may be transferred to a non-printing location in the floor 204 of the plate in a location inside the image region 205 of the plate.

Another method for storing a code on the plate floor comprises using micro dots, such as are disclosed in EP 1 557 279 B1, incorporated herein by reference. The term "microdots" refers to small mask openings in the LAMs layer of a flexo plate, wherein each opening is not wide enough to grow a printable screen dot in isolation, but clusters of them are operable to raise the plate floor level. Thus, a cluster of microdots may be used to form sections of elevated floor relative to other sections of the floor that remain non-elevated and arranged in a formation resembling the dark and light sections in a QR-code or a barcode.

In one embodiment, the test strip and/or the code contains a test pattern that allows plate quality to be checked, such as a check with a confocal microscope, after processing of the plate, to determine if the plate processing was successful such that the plate may be approved for printing.

Another embodiment may comprise two identical test strips 210, one of which (not shown) may be cut off and sent separately from the plate to a proofing service, while the rest of the plate is sent to the printer. In such an embodiment, positive proofing of the test strip may be a prerequisite for the printer to start to print the plate. This method may prevent printing of plates having artifacts, thus saving money associated with failed prints. Identification information for processing the test strip and the printing plate may be established by the code.

In still another embodiment, the process data may be stored in the plate by means of a strip at the side of the plate, the strip containing a pattern of spots, such as, for example, "high" spots having a first elevation (e.g. reaching the plate printing surface), and "low" spots having a second elevation (e.g. below the plate printing surface). In other embodiments, the high spots may have a first relatively lesser distance below the plate printing surface, and the low spots may have a second relatively greater distance below the plate printing surface. The spot sequence represents a digital data "word" comprising sequences of high and low bits, like in a serial data transmission. The data word contains the information to be stored in the plate. Thus, for example, the code may be stretched out along a run length of the plate but having only a very narrow width. The advantage of this type of code over a standard 2D code such as a bar code or QR code, is that the code only requires a small stripe near the image, which makes it easier to add when not much space free of images is available on the plate. Such a code, in principal, is similar to a very long bar code, but able to carry more information because of its length. The corresponding reader may, for example, sense dark/light contrast or distance from the reader due to length of travel of a beam from the reader to the surface of the high or low spots, or may use laser triangulation sensors or computer image evaluation. A preferred reader is configured as a swipe code scanner in which the scanner is stationary while the plate with the code moves along under the scanner. In some embodiments, a mechanical sensor capable of sensing the difference between the relative elevations of high and low spots may read the code as the sensor head moves in accordance with the dot elevation. Another aspect of the invention includes monitoring the status of the workflow by software in a central computer, such as computer 170 depicted in FIG. 1. Each process stage 110, 120, etc. sends information to the central computer after scanning the code from the polymer, such as reporting the time and place of arrival of the plate and the current processing status. Thus the actual status of a job in the workflow can be determined immediately and exactly from the central computer. Certain plates may thus be identified and located instantly in the company workflow. The central computer 170 is programmed with software capable of processing all this information of different plates from different stages of production, such as for example the ESKO Device Manager. The code or indicia may also be read in-between process steps or after completion of the process steps, such as in a storage area or in a queue awaiting processing.

In another embodiment, the information stored in the indicia may be scanned and read by application software running on a mobile device, such as a mobile phone or tablet computer. As is known in the art, systems incorporating such mobile devices typically include a first portion of software running on the mobile device, with the mobile device in communication with a server over a communication network, such as a wireless network, wherein a second portion of the software resides on the server and interfaces with the portion on the mobile device. Such a system permits immediate identification of plates anywhere in the workflow, including for example, identifying the location of plates in storage dedicated for reprint jobs. In an exemplary method, such as that depicted in FIG. 2A, reader 220, such as a mobile phone, may scan the code on the plate and then provide process parameter information to an operator, such as on the display 222 of the phone or on the display associated with a user interface corresponding to the process equipment (110, 120, etc.) relating to the current processing step. The operator may then enter the relevant process parameters into the process equipment for the next process step, if that equipment is not in communication with the scanning means to read process parameters automatically.

One aspect of the invention comprises controlling and coordinating the various process steps in a way that the overall process is optimized in time and efficiency. Aspects of the claimed invention include not only providing process parameters to the processing machines (110, 120, etc.) for the various pre-press process stages in the workflow of making a flexo plate, but also providing real-time monitoring of the overall plate manufacturing process using readers 220 communicating the in-process locations of a plurality of plates in accordance with scans. Thus, a central tracking processor or "device manager" 170 may receive updates continuously during all process steps of the workflow and thus may be capable of providing a real-time plot of each plate's current position in the entire plate workflow. As used herein, the term "real-time" is intended to mean providing current information contemporaneously, subject to routine delays inherent in the communication protocols, processor speeds, and display rendering capabilities of the various components of the system. In some implementations, in addition to location information, process quality feedback may also be communicated to the Device Manager 170. The Device Manager 170 may be integrated into, for example, Automation Engine software from Esko, the Applicant of the present invention. Although certain specific workflow steps have been mentioned, it should be understood that the indicia may include information relating to other processing machines or process steps in addition to those described explicitly herein, and may, for example, cover any or all process steps between order intake at least until storage after printing or reprinting, which may be applicable for printers who make their own plates. The process is not limited to any number of steps, however, and thus in some embodiments, the process may cover fewer or more steps.

Figure 3:
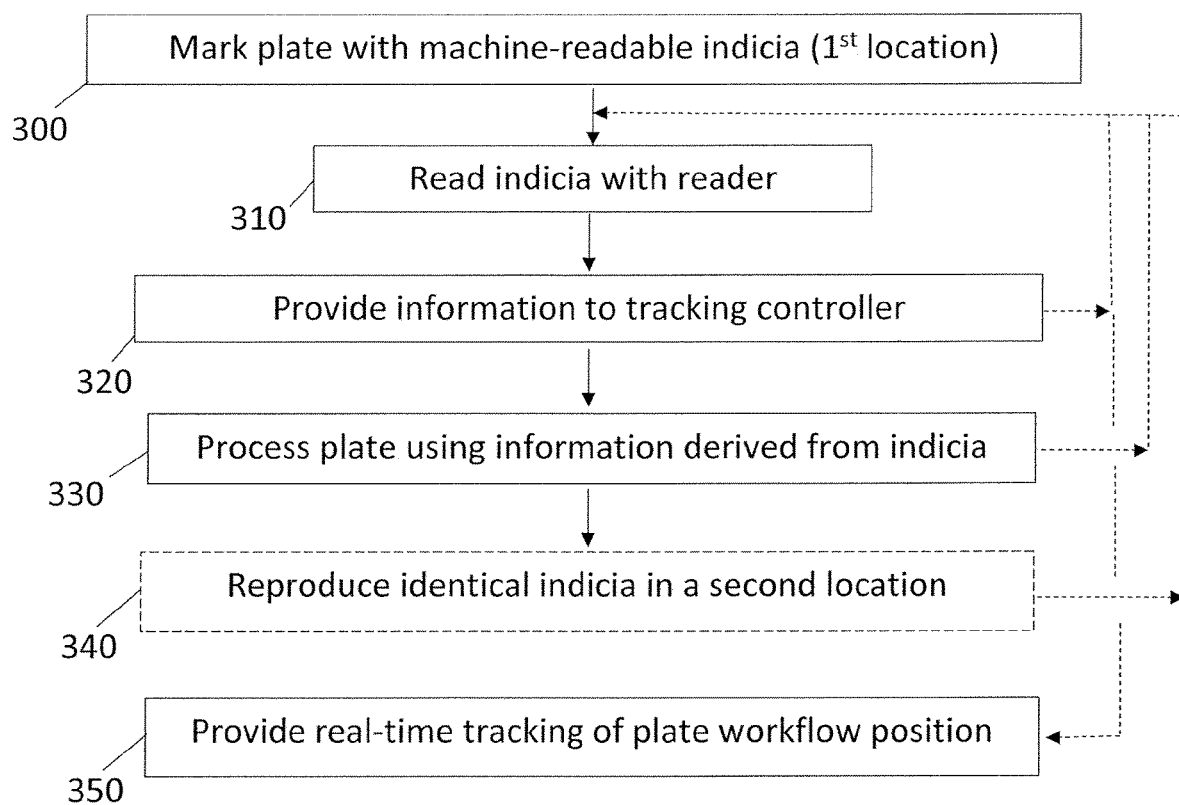
FIG. 3 is a flowchart depicting an exemplary process of the invention.

Thus, one aspect of the invention comprises a process for making a flexo plate. A flowchart corresponding to an exemplary process is depicted in FIG. 3. The process may have a plurality of process steps, such as at least an imaging step, a curing step, a washing step, a cutting step, a printing step, and a storage step, each step performed by a processing machine having at least one variable operating parameter. It should be understood that some processes do not require a cutting step. Also, in some processes, plates are discarded after the printing step and are not stored. Thus, the cutting and storage steps are optional, depending upon the process. Furthermore, it should be understood that not every process step may require instructions for every plate, and thus some indicia may embody instructions for fewer than all of the steps in the process. In general, however, at least some embodiments of the invention embody instructions for more than one process step in the workflow. The term "variable operating parameter" means any parameter which may vary depending upon the plate or job, and thus the processing machine requires some input for control of the processing. Step 300 comprises providing machine-readable indicia on the flexo plate. The machine-readable indicia is preferably configured to provide readability downstream of the washing and cutting steps without printing in the printing step. Providing the machine readable indicia comprises embodying in the indicia information including at least a plate identifier and instructions corresponding to the at least one variable operating parameter for each of the processing machines or embodying in the indicia an address in computer storage where such information resides. Step 310 comprises reading the indicia from the flexo plate using a reader in communication with at least a controller of each of the processing equipment configured to perform one of the process steps. Step 320 comprises providing information about the location of the plate in the workflow to a tracking controller. Step 330 comprises processing the plate with the processing machine using the at least one variable operating parameter embodied in the indicia or stored at the address embodied in the indicia. The order of steps 320 and 330 may be reversed. Steps 310-330 may then be repeated for subsequent machines or process steps in the workflow. In some cases, reading the indicia in step 310 and reporting the information to the tracking controller in step 320 may be performed by a reader that is not associated with a processing machine, such as a mobile device, for reporting a location of the plate intermediate of process steps, in storage, or in transit. The process may include in step 350 providing real-time tracking of workflow position for each of the plurality of in-process flexo plates. This step may be practiced at any time during the process after receiving information from the one or more readers in the workflow.

The indicia may be configured to embody quality information indicative of printing properties associated with the plate, in which case "processing" the plate in step 330 may comprise proofing the printing plate by analyzing the quality information embodied in the indicia.

Although the invention is not limited to any particular information or instructions embodied in the machine-readable indicia, each process step may have certain parameters that are particularly well suited for implementation using embodiments of the invention. For example, in a mounting step, the indicia may contain information indicative of the physical position of the plate/slug/patch on a substrate or printing sleeve (e.g. flexo plate left printing lane/middle printing lane/Right printing lane). The indicia may also contain information indicative of the physical coordinates for the mounting cameras of the mounting device. Similarly, in a curing step, such as a UV curing step, the instruction may provide UV exposure parameters, such as exposure time, intensity, and the like. In a "washing" or other non-cured-polymer-removal step, the instructions may comprise processing parameters such as temperature, time, and type (water, solvent, thermal). In a plate cutting step, the instructions may include the corresponding cut file and cutting parameters, such as type of cutting blade, thickness and type of the substrate to be cut, and the like. In a quality control step, the instructions may include instructions for loading a specific portion of the plate under process to a device for conducting a quality control (QC) evaluation, along with information for verification relative to information detectable using the device. For example, the evaluation device may be a monitor in which the loaded information is an image of the portion of the plate that can be viewed by the human operator, or the device may be a sensor for measuring plate height or dot shape or size, and the measured value may be automatically compared against a stored value. QC steps may be performed at any point in the workflow. In the printing step, the parameters may include any specialized inks to use, color curves to apply, as well as instructions regarding what location of the printed result should be the subject of a QC evaluations using the onboard machine vision system, such as systems made by AVT, a subsidiary of Danaher Corporation.

Any number of other process parameters may be included instead or in addition, and the invention is not limited to any particular process parameters for any particular process step, nor does each indicia necessary contain information corresponding to each process step. It should be noted that although discussed herein in the context of a single indicia, the amount of data to be stored may exceed what is practical to embed in a single instance of certain types of indicia. Accordingly, multiple indicia may be used, and the information embedded in a first indicia may comprise the coordinates for the location of a second indicia with instructions for a particular step of interest. As indicated in step 300, the indicia may be initially placed in a first location, in which the process further comprises the optional step 340 of conducting at least one processing step with the indicia in the first location, then reading the indicia with a first reader after that processing step, and reproducing the indicia in a second location prior to the printing step. This optional step may be particularly useful when the first location is, for example on a test strip, that is ultimately cut away in a cutting step, and the second location is in a floor of the plate in an image area of the plate, as described herein.

Although certain aspects of the invention are particularly useful and advantageous in a flexo environment, the disclosure herein is not limited to any particular type of plate or processing.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for making a flexo plate, the process comprising a plurality of process steps, including at least an imaging step, a curing step, a washing or other non-cured-polymer-removal step, and a printing step, each step performed by a processing machine having at least one variable operating parameter, the process comprising:
    providing machine-readable indicia on the flexo plate, wherein the machine-readable indicia is configured to provide readability downstream of the washing or other non-cured-polymer-removal step without printing in the printing step;
    embodying in the indicia address-identifying information corresponding to an address in computer storage where instructions reside corresponding to at least one variable operating parameter for each of the processing machines;
    reading the indicia from the flexo plate using a reader in communication with at least a controller of each of the processing equipment configured to perform one of the process steps; and
    programming each of the processing equipment using the at least one variable operating parameter embodied in the indicia or stored at the address embodied in the indicia.

2. The process of claim 1, wherein the indicia or the instructions residing at the address in computer storage further embody quality information indicative of printing properties associated with the plate, the process further comprising proofing the printing plate by analyzing the quality information.

3. The process of claim 1, wherein the process further includes a cutting step, a storage step, or a combination thereof.

4. The process of claim 1, wherein the indicia comprises a QR-code.

5. The process of claim 1, wherein the indicia comprises a bar code.

6. The process of claim 1, wherein the indicia is configured to be read and interpreted by both a human operator and a machine.

7. The process of claim 6, wherein the indicia includes printed or otherwise visible alphanumeric characters.

8. The process of claim 1, wherein the indicia comprises a magnetic stripe.

9. The process of claim 1, wherein the indicia is disposed in a portion of polymer that comprises the plate.

10. The process of claim 1, wherein the indicia comprises a code disposed on a floor of the plate using clusters of microdots arranged according to the code, the process comprising imaging the microdots during a LAMS layer imaging step, wherein the microdots are arranged in the LAMS layer so as to produce structures on the plate that rise above the floor of the plate but not to a printing level.

11. The process of claim 1, wherein the indicia comprises areas of presence and absence of polymer in the floor of the plate, and the areas of absence of polymer that define the indicia are milled into a floor of the plate.

12. The process of any claim 11, wherein the indicia comprises an RFID module.

13. The process of claim 1, wherein one or more of the readers comprises a mobile device.

14. The process of claim 13, wherein the indicia comprises a code disposed on a floor of the plate using areas of presence and absence of polymer in the plate floor, the process comprising modulating a laser beam according to the code to remove polymer in the areas of absence of polymer.

15. The process of claim 13, wherein the indicia or the instructions residing at the address in computer storage further comprises a plate identifier, the process further comprising using the mobile device to read the plate identifier and identify the plate in between process steps.

16. The process of claim 1, wherein the indicia or the instructions residing at the address in computer storage further comprises a plate identifier and the process further comprises providing a tracking controller for the workflow, the tracking controller in communication with each of the readers associated with each of the processing machines, reading the indicia from a plurality of in-process flexo plates in the workflow, communicating location of the in-process flexo plates to the tracking controller, and providing realtime tracking of workflow position for each of the plurality of in-process flexo plates.

17. The process of claim 1, further comprising providing the indicia on the flexo plate in a first location, conducting at least one processing step with the indicia in the first location, reading the indicia with a first reader after the at least one processing step, and reproducing the indicia in a second location prior to the printing step.

18. The process of claim 17, wherein the first location is cut away in a cutting step and the second location is in a floor of the plate in an image area of the plate.

19. A system for making a flexo plate, the system comprising:
    a plurality of processing machines, each processing machine configured to perform one or more process steps in a workflow, including an imaging step, a curing step, a washing or other non-cured-polymer-removal step, and a printing step, and optionally, a cutting step, a storage step, or a combination thereof, each processing machine having a controller and at least one variable operating parameter controlled by the controller;
    means for providing machine-readable indicia on the flexo plate, the machine-readable indicia configured for persistent readability downstream of the washing or other non-cured-polymer-removal and optional cutting steps without printing in the printing step, the machine-readable indicia address-identifying information corresponding to an address in computer storage where instructions reside corresponding to at least one variable operating parameter for each of the processing machines;
    a plurality of readers configured to read the indicia on the flexo plate, including at least one reader in communication with each controller of each processing machine, wherein the controller is configured to receive from the reader the instructions corresponding to the at least one variable operating parameter stored in or linked to the indicia and to control the processing machine in accordance with that at least one instruction.

20. A flexo plate, the plate comprising:
machine-readable indicia on the flexo plate, the machine-readable indicia configured for persistent readability downstream of washing or other non-cured-polymer-removal and optional cutting steps without printing in a printing step of a plate workflow, the machine-readable indicia address-identifying information corresponding to an address in computer storage where instructions reside corresponding to at least one variable operating parameter for each of the processing machines.

21. Computer readable media comprising non-transitory instructions readable by a machine for coordinating a process for making a flexo plate, the process comprising a plurality of process steps, including at least an imaging step, a curing step, a washing or other non-cured-polymer-removal step, and a printing step, each step performed by a processing machine having at least one variable operating parameter, the instructions comprising:
   instructions for providing machine-readable indicia on the flexo plate, address-identifying information corresponding to an address in computer storage where instructions reside corresponding to at least one variable operating parameter for each of the processing machines.

22. Computer readable media comprising non-transitory instructions readable by a machine for coordinating a process for making a flexo plate, the process comprising a plurality of process steps, including at least an imaging step, a curing step, a washing or other non-cured-polymer-removal step, and a printing step, each step performed by a processing machine having at least one variable operating parameter, the instructions comprising:
   instructions for providing machine-readable indicia on the flexo plate, including embodying in the indicia address-identifying information corresponding to an address in computer storage where instructions reside corresponding to at least one variable operating parameter for each of the processing machines;
   instructions for storing, in the computer storage in a location identified by the information corresponding to the address, information including at least a plate identifier and at least one variable operating parameter for each of the processing machines;
   instructions for receiving a communication from a reader of the indicia; and
   instructions for transmitting the at least one variable operating parameter to a corresponding one of the processing machines.

* * * * *